United States Patent [19]

Jarwala et al.

[11] Patent Number: 5,331,274
[45] Date of Patent: Jul. 19, 1994

[54] METHOD AND APPARATUS FOR TESTING EDGE CONNECTOR INPUTS AND OUTPUTS FOR CIRCUIT BOARDS EMPLOYING BOUNDARY SCAN

[75] Inventors: Najmi T. Jarwala, Lawrenceville, N.J.; Chi W. Yau, Holland, Pa.

[73] Assignee: AT&T Bell Laboratories, Murray Hill, N.J.

[21] Appl. No.: 80,480

[22] Filed: Jun. 24, 1993

Related U.S. Application Data

[63] Continuation of Ser. No. 844,060, Mar. 2, 1992, abandoned.

[51] Int. Cl.$^5$ ............................................. G01R 31/02
[52] U.S. Cl. .................... 324/158.1; 324/73.1; 371/22.3
[58] Field of Search ............. 324/73.1, 158 R, 158 T; 371/15.1, 22.3, 22.6, 25; 437/8

[56] References Cited

U.S. PATENT DOCUMENTS

| | | | |
|---|---|---|---|
| 3,854,125 | 12/1974 | Ehling et al. | 324/15.1 |
| 4,707,833 | 11/1987 | Tamaru | 371/22.3 |
| 4,710,931 | 12/1987 | Bellay et al. | 371/22.3 |
| 4,791,358 | 12/1988 | Sauerwald et al. | 371/22.3 |
| 4,963,824 | 10/1990 | Hsieh et al. | 324/158 R |
| 4,967,142 | 10/1990 | Sauerwald et al. | 324/73.1 |
| 5,029,166 | 7/1991 | Jarwala et al. | 371/22.1 |
| 5,056,093 | 10/1991 | Whetrel | 371/22.3 |
| 5,115,435 | 5/1992 | Langford, II et al. | 371/22.3 |
| 5,132,635 | 7/1992 | Kennedy | 371/15.1 |
| 5,155,732 | 10/1992 | Jarwala et al. | 324/73.1 |
| 5,173,377 | 12/1992 | Robinson et al. | 371/22.3 |

FOREIGN PATENT DOCUMENTS 2225866 6/1990 United Kingdom .

OTHER PUBLICATIONS

*IEEE Standard Test Access Port and Boundary Scan Architecture,* Chapter 1, May 21, 1990, IEEE, New York, N.Y.
IBM Technical Disclosure Bulletin, vol. 34, No. 10A, Mar. 1992, New York, N.Y., pp. 178-179, "I/O Logic Test."
*Patent Abstracts of Japan,* vol. 016, No. 060 (p. 1312)14, Feb. 1992, & JP-A-32 57 385 (Fujitsu), Nov. 15, 1991.
*Microprocessor and Microsystems,* vol. 15, No. 2, Mar. 1991, London GB, pp. 82-90, A. J. van de Goor et al., "A Low-Cost Tester for Boundary Scan."

*Primary Examiner*—Vinh Nguyen
*Attorney, Agent, or Firm*—Robert B. Levy

[57] ABSTRACT

Both the input/output connections (16) of a circuit board (10) and the boundary scan devices ($12_1$-$12_n$) thereon can be tested simultaneously by boundary scan techniques using a Serial Test Extension Module (STEM) (28) which mates with the circuit board. The STEM (28) contains at least one boundary scan register (36) which makes an electrical connection with a separate circuit board input/output connection (16) when the STEM mates with the board. The boundary scan registers (36) within the STEM (28) are serially connected in a chain, that is, connected in series with a chain of serially connected boundary scan registers (20) within the boundary scan devices ($12_1$-$12_n$). By launching a known bit stream into the chain of boundary scan registers (20) and (36) and thereafter shifting out the bits and comparing them to a reference bit stream, representing a defect-free condition, faults in the input/output connections (16) and/or in the devices ($12_1$-$12_n$) can be detected.

8 Claims, 3 Drawing Sheets

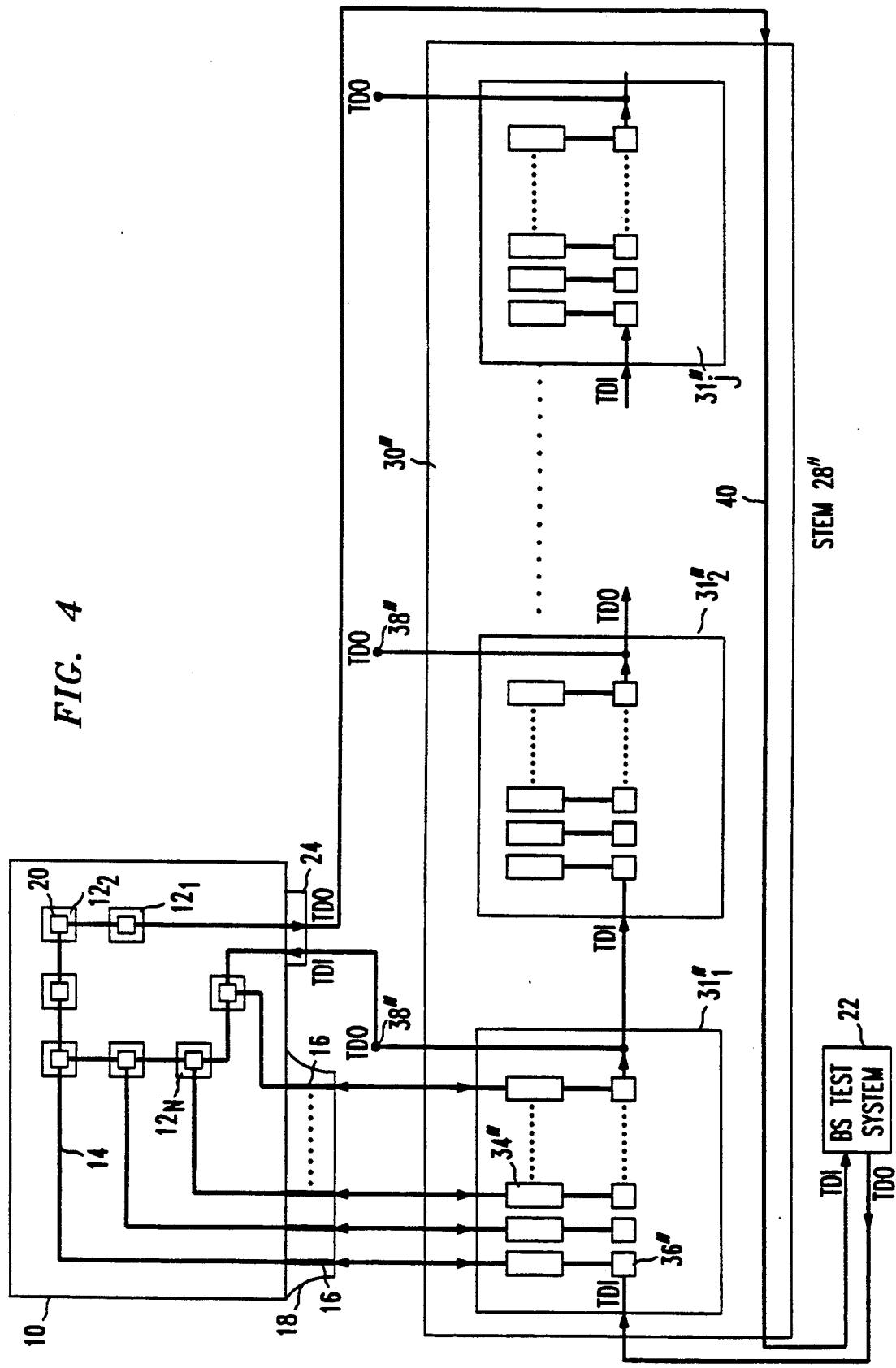

METHOD AND APPARATUS FOR TESTING EDGE CONNECTOR INPUTS AND OUTPUTS FOR CIRCUIT BOARDS EMPLOYING BOUNDARY SCAN

This application is a continuation of application Ser. No. 07/844,060, filed on Mar. 2, 1992, now abandoned.

TECHNICAL FIELD

This invention relates to a technique for electrically testing both the input and output connections of a circuit board, and the devices on the board, using boundary scan techniques.

BACKGROUND OF THE INVENTION

There has now been developed an electronic test technique, described in the *ANSI/IEEE* 1149.1 *Test Access Port and Boundary Scan Architecture* standard, which permits testing of devices on a circuit board embodying this architecture through a four-wire port on the board. Such testing is accomplished, in accordance with the ANSI/IEEE 1149.1 standard, by entering a known string of bits to the boundary scan devices. As the bits are entered, each bit is shifted into a corresponding boundary scan register within a device, which register is associated with a device's signal input or output pin. The shifting of a bit into a boundary scan register associated with a device input pin will cause a change in the status of the bit in one or more boundary scan registers, within the same device or other devices which are dependent on the signal at this input pin. The registers in the device are coupled in a serial chain so that by shifting out the bits from the chain of registers and comparing the shifted-out bit string to a known string produced under defect-free conditions, the operation of the boundary scan devices on the circuit board can be tested.

Complete testing of a circuit board requires not only that the devices be tested, but that the input/output connections to the board be tested as well. In the past, the circuit board input and output connections, which are typically made through separate pins of an edge connector carried by the board, were tested by applying test stimuli in parallel to the edge connector pins. Following application of the test stimuli, the response generated to the stimuli was sensed and analyzed. To simultaneously test both the devices on the circuit board and the input/output (I/O) connections, the stimuli applied to the edge connector pins had to be synchronized to the string of bits shifted through the boundary scan registers in the devices on the board. Such synchronization has required very complex test hardware and software which has increased the cost of testing circuit boards. Moreover, parallel test hardware is itself costly.

Thus, there is a need for a technique for simultaneously testing both the boundary scan devices on a circuit board and the circuit board I/O connections without the need for synchronization of the test signals.

SUMMARY OF THE INVENTION

Briefly, in accordance with a preferred embodiment of the invention, a technique is provided for testing at least one input/output (I/O) connection of a circuit board simultaneously with the testing of at least one device on the board which contains at least one first boundary scan register. In accordance with the technique, each I/) connection to the board is connected to a separate, second boundary scan register. Typically, each of the second boundary scan registers is carried by a Serial Test Extension Module (STEM) which physically mates with the pins of an edge connector on the circuit board through which the I/O connections to the board are made. The second boundary scan registers are connected serially, in daisy chain fashion, with the first boundary scan registers to form a single chain of registers. Actual testing is carried out by shifting a known stream of bits through the combined chain of first and second boundary scan registers so that each bit in the stream is latched into a separate one of the registers. Thereafter, the bits are shifted out of the registers and the resultant chain of bits is then compared to a reference bit stream, representing the bit stream that would be obtained when there are no device or I/O connection faults. Any fault in either an I/O connection or in a device will be reflected in a difference between the stream of bits actually shifted out and the reference bit stream.

As may be appreciated, by coupling each edge connector pin to a separate, second boundary scan register on the STEM, and by coupling the second boundary scan registers in series with the first boundary registers in the devices, the edge connector pins are thus "integrated" with the devices on the circuit board in a single boundary scan chain. In this way, the I/O connections made through the edge connector pins can be tested simultaneously with the devices on the circuit board using boundary scan techniques, thus avoiding the need to synchronize the test signals applied to the devices and to the edge connector pins.

BRIEF DESCRIPTION OF THE DRAWING

FIG. 4 is a block schematic diagram of a second alternate preferred embodiment of the apparatus of FIG. 2.

DETAILED DESCRIPTION

Figure 1:
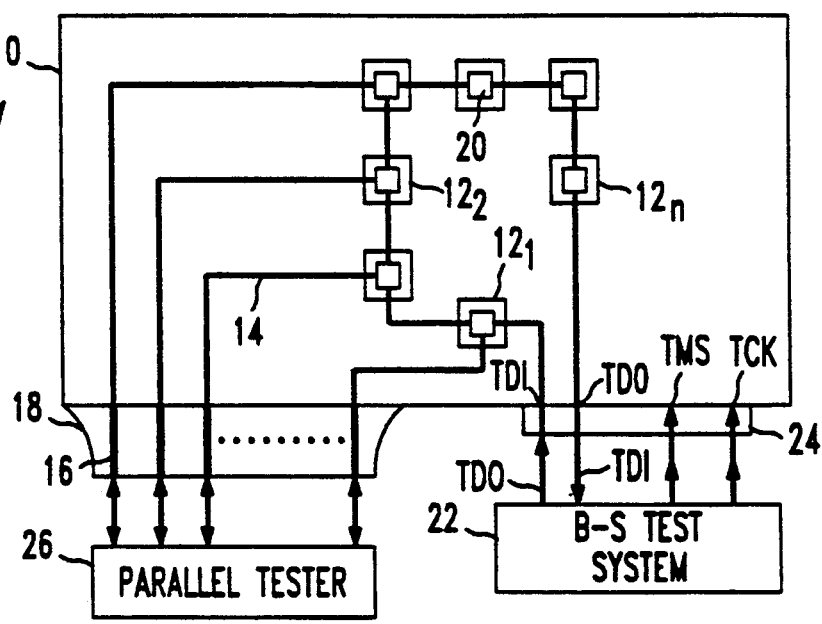
FIG. 1 is a block schematic diagram of a circuit board showing the manner in which devices on the board and the I/O connections to the board were tested simultaneously according to the prior art.

FIG. 1 is a block schematic diagram of a circuit board 10, according to the prior art, which carries one or more electronic devices $12_1, 12_2, 12_3 \ldots 12_n$ where n is an integer of one or greater. Selected ones of the devices $12_1$-$12_n$ have at least one external signal line 14 through which an input and/or output signal is carried to and/or from the device. Each of the signal lines 14 is connected to a separate one of a set of pins 16 of an edge connector 18 on the circuit board 10 through which external signals are coupled to and/or from the board.

In the preferred embodiment shown in FIG. 1, each of the devices $12_1$-$12_n$ is constructed in accordance with the *ANSI/IEEE* 1149.1 *Test Access Port and Boundary Scan Architecture* standard, and incorporates at least one first boundary scan register 20. Typically, each device $12_i$ (where $i = 1, 2 \ldots n$) may incorporate a plurality of first boundary scan registers 20, but only one such register is shown in FIG. 1 for purposes of simplicity. (While the devices $12_1$-$12_n$ are themselves configured as boundary scan devices, the board 10 may also include non-boundary scan devices (not shown)). Each first boundary scan register 20 within each device $12_i$ is coupled serially, in daisy chain fashion, with the other register(s) in the same device, and this chain is connected with the register chains in the other devices to form a boundary scan chain. Note that the non-boundary scan devices, if any, on the board 10 are not part of the scan chain.

The boundary scan chain of registers 20 facilitates testing of the devices via a known boundary scan test system 22 which is coupled to the circuit board 10 through a four-wire Test Access Port (TAP) 24 which has a Test Data Input (TDI), a Test Data Output (TDO), a Test Clock Input (TCK) and a Test Mode Select (TMS) input. It is through the TDI, and the TMS and TCK inputs of the circuit board that the boundary scan test system 22 supplies input test data, a test mode select signal and a test clock signal, respectively, to the circuit board 10 to carry out boundary scan testing as described below. The TDO of TAP 24 of the circuit board 10 serves as the output from which test data from the circuit board is withdrawn and input to the TDI of the test system 22.

The boundary scan test system 22 carries out testing of the devices $12_1$-$12_n$ by launching a stream of known bits into the TDI of the TAP 24 of the board 10 so that each bit in the stream is latched into a separate one of the first boundary scan registers 20. Depending on the internal structure of each device $12_i$ which embodies boundary scan, and the manner in which each device is interconnected to the others, the presence of a bit of particular value in one register 20 may cause the bit in one or more other registers to change states when the devices are operating properly. To determine whether the correct bit transition has occurred, the bits latched into the registers 20 are shifted out through the TDO of the TAP 24 and into the TDI of the boundary scan test system 22, following a predetermined interval after input of the test bit stream to the circuit board 10. The string of bits shifted out of the circuit board 10 is compared by the boundary scan test system 22 to a reference bit string, representing the string of bits that is expected to be obtained when all of the devices $12_1$-$12_n$ are operating properly.

To completely test the circuit board 10, not only must the devices $12_1$-$12_n$ themselves be tested, either by the above-described boundary scan technique or otherwise, but the input/output (I/O) connections made through the edge connector pins 16 must also be tested. Such testing is necessary because even though each device $12_i$ may be operating properly, a fault in a signal line 14 or in an edge connector pin 16 may render the circuit board 10 inoperative. In the past, testing of the I/O connections of the circuit board 10 was carried out by coupling each signal-carrying edge connector pin 16 to a corresponding channel of a parallel testing machine 26, as is known in the art. The parallel testing machine 26 carries out testing of the I/O connections made through the edge connector pins 16 by launching test stimuli, in parallel, to the pins, and thereafter recovering and analyzing the response generated following application of the stimuli.

The disadvantage incurred by testing the circuit board 10 in this manner is that simultaneous testing of both the I/O connections made through the edge connector pins 16 and the devices $12_1$-$12_n$ requires that the bit stream launched into the TDI of the board from the boundary scan tester 22 be synchronized to the stimuli launched into the pins by the parallel tester 26. To obtain such synchronization requires a high degree of complexity in both the parallel tester 26 and the boundary scan test system 22, as well as in their operating software. Moreover, the parallel tester 26 tends to be costly, making testing of the I/O connections costly for this reason alone.

Figure 2:
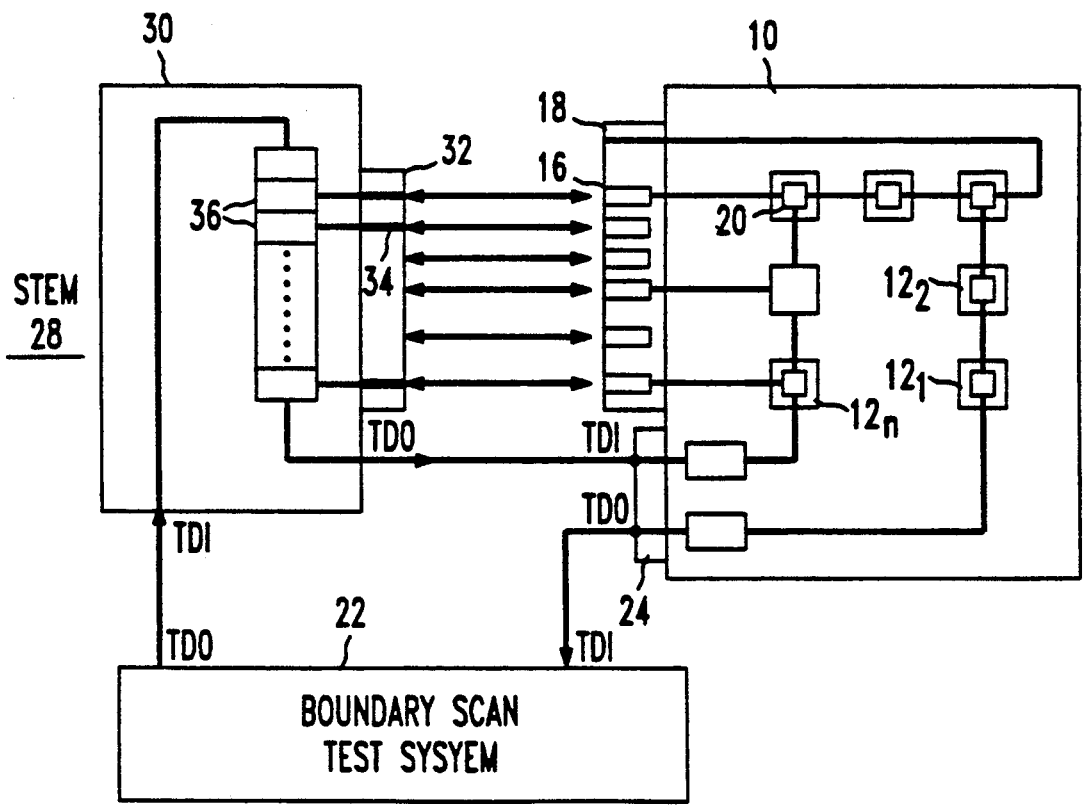
FIG. 2 is a block schematic diagram of the circuit board of FIG. 1 coupled to an apparatus, in accordance with the invention, for simultaneously testing the I/O connections and the devices on the circuit board using boundary scan techniques.

Referring now to FIG. 2, there is shown a Serial Test Extension Module (STEM) 28, in accordance with the teachings of the present invention, for facilitating simultaneous testing of both the I/O connections to the circuit board 10 and the devices $12_1$-$12_n$ carried on the board without the need for synchronization, or even the need for the parallel test system 26 of FIG. 1. The STEM 28 comprises a body 30 which mounts a socket 32 complementary to the edge connector 18 on the circuit board 10 for mating engagement therewith. Within the socket 32 is a plurality of contacts 34, each adapted to make an electrical connection with a corresponding one of the edge connector pins 16 when the socket is mated with the edge connector 18.

Within the body 30 of the STEM 28 is a plurality of second boundary scan registers 36, each similar in construction to each first boundary scan register 20 within each device $12_i$. Each second boundary scan register 36 is electrically connected to a separate one of the contacts 34 in the socket 32 so as to be responsive to an I/O signal at a corresponding edge connector pin 16 when the socket and edge connector 18 are mated. Like the first boundary scan registers 20 which are serially connected in a daisy chain, the second boundary scan registers 36 are likewise serially connected in a daisy chain.

The chain of second boundary scan registers 36 has a Test Data Input (TDI) and a Test Data Output (TDO) (as well as TMS and TCK inputs (not shown)). In accordance with the invention, the TDI and TDO associated with the chain of second boundary scan registers 36 in the STEM 28 are coupled to the TDO of the boundary scan test system 22 and to the TDI of the TAP 24 of the circuit board 10, respectively. In this way, the chain of second boundary scan registers 36 in the STEM 28 is coupled in series with, so as to be "integral" to, the chain of first boundary scan registers 20 on the circuit board 10.

To test both the devices $12_1$-$12_n$ on the circuit board 10, as well as the I/O connections made to the board through the edge connector pins 16, the boundary scan test system 22 launches a known string of bits into the TDI of the STEM 28. The bits launched into the STEM 28 are shifted through the chain of second boundary scan registers 36 and through the first chain of registers 20 in the devices $12_1$-$12_n$ so that a separate bit in the chain is latched into a corresponding register. After a predetermined interval to allow the bits in the registers 20 and 36 to transition in the manner described previously, the bits are shifted out of the first and second boundary scan registers 20 and 36 through the TDO of the circuit board TAP 24 and are input to the boundary scan test system 22 at its TDI. The boundary scan test system 22 then compares the shifted-out stream of bits to a reference stream, corresponding to a stream of bits expected to be shifted out when non-defects are present, to establish the presence of defects (if any) in the devices $12_1$-$12_n$ and in the I/O connections.

The advantage of the using the STEM 28 to effectuate testing of the I/O connections to the circuit board 10 is that the need for synchronization is eliminated. By providing a set of second boundary scan registers 36 serially linked to the chain of first registers 20, the STEM 28 effectively integrates the devices $12_1$-$12_n$ with the edge connector pins 16. In this way, both the devices $12_1$-$12_n$ and the I/O connections made by the edge connector pins 16 can be tested simultaneously using boundary scan techniques. Thus, the need for a costly parallel test system, such as the system 26 of FIG. 1, is avoided.

Figure 3:
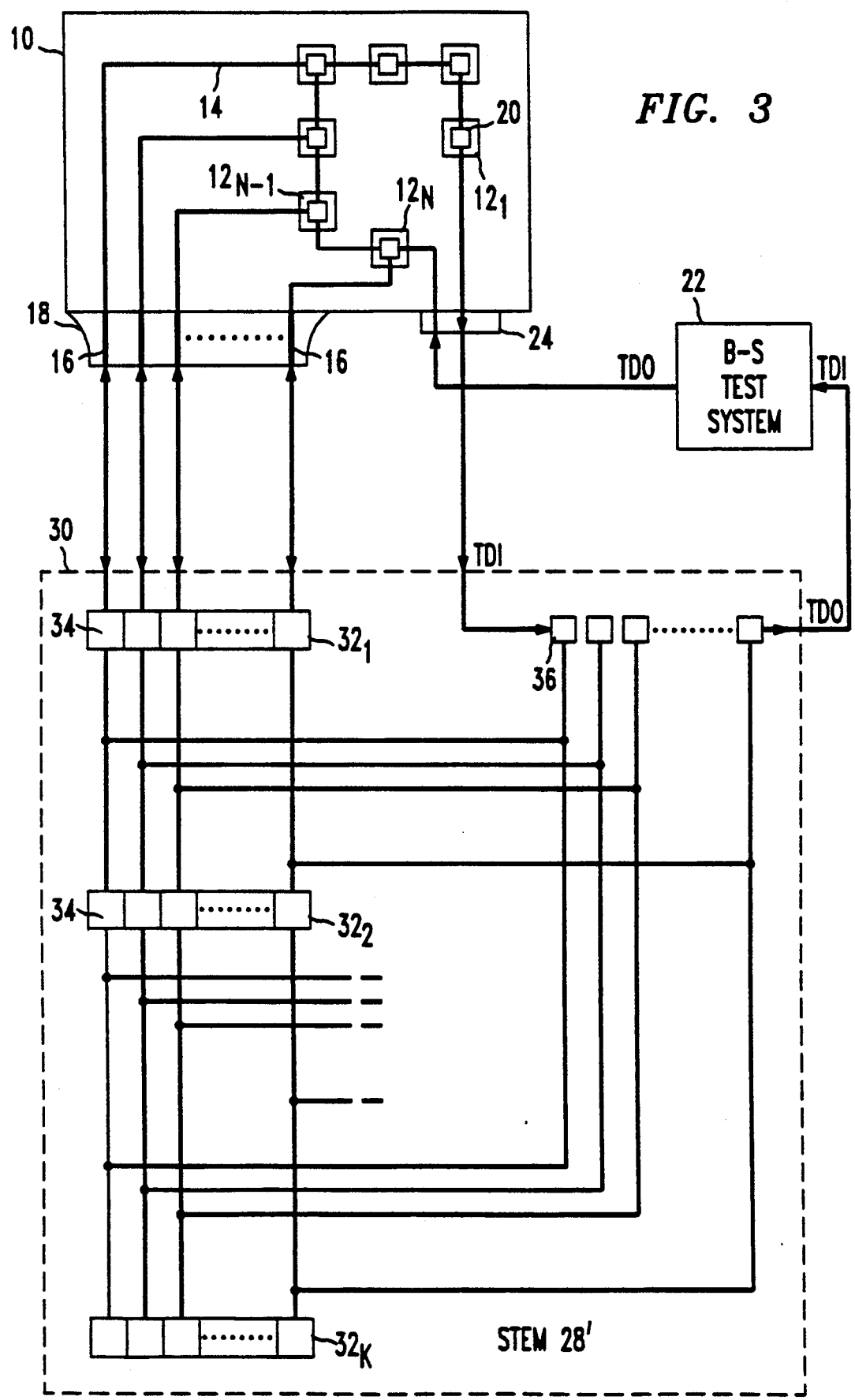
FIG. 3 is a block schematic diagram of a first alternate preferred embodiment of the apparatus of FIG. 2.

Referring to FIG. 3, there is shown a first alternate preferred embodiment 28' of a STEM in accordance with the invention. The STEM 28' of FIG. 3 differs from the STEM 28 of FIG. 2 in that the STEM 28' is provided with a plurality of separate sockets $32_1, 32_2 \ldots 32_k$ (where k is an integer). Each of the sockets $32_1, 32_2 \ldots 32_k$ has a different physical configuration for mating with a particular style of edge connector 18 on a circuit board 10 to allow different types of circuit boards to be mated with the stem 28'. Within each socket $32_j$ (where $j = 1, 2, \ldots k$) is a set of contacts 34, each of which is coupled to a separate, second boundary scan register 36 in parallel with a corresponding contact in each of the other sockets. Although not shown, each contact 34 in each socket has a circuit associated therewith for rendering the contact capable of accepting a signal at a particular logic level (TTL, ECL, CMOS, etc.). As with the STEM 28 of FIG. 2, the second boundary scan registers 36 of the STEM 28' of FIG. 3 are serially coupled, in daisy chain fashion, with the chain of first boundary scan registers 20 in the devices $12_1$-$12_n$.

Testing of the circuit board 10 of FIG. 3 with the STEM 28' of FIG. 3 is carried out by the boundary scan test system 22 in the same manner as the STEM 28 of FIG. 2. A stream of bits is launched by the boundary scan test system 22 of FIG. 3 into the TDI of the STEM 28' so that the bits are shifted through the second and first boundary scan registers 36 and 20, causing a separate bit to be latched into a corresponding one of the registers. Thereafter, the bits shifted into the second and first boundary scan registers 36 and 20, respectively, are shifted out through the TDO of the circuit board 10. The only difference between the STEM 28' and the STEM 28 is that the former affords the flexibility of being able to accommodate different types of edge connector configurations, which is a decided advantage.

FIG. 4 illustrates a second alternate preferred embodiment 28" of a STEM, in accordance with the invention, for facilitating boundary scan testing of both the devices $12_1$-$12_n$ on the circuit board 10 and the I/O connections made by the edge connector pins 16. The stem 28" of FIG. 4 comprises a body 30" which mounts a plurality of separate modules or cards $31"_1$-$31"_m$, where m is an integer, typically although not necessarily, equal to 10. Each of the modules $31"_1$-$31"_m$ includes a plurality of individual contacts 34" (typically ninety-six in number), each adapted to mate with a corresponding one of the edge connector pins 16 of the edge connector 18 on the circuit board. In practice, when each of the modules $31"_1$-$31"_m$ is inserted into the body 30", the contacts 34" of the modules are aligned with each other so as to allow the circuit board 10, having a long array of edge connector pins 16, to be accommodated by the contacts of one or more modules. Although not shown, a circuit is provided with each contact 34" of each module $31"_1$-$31"_m$ to render the contact of that module capable of handling a particular logic level signal (TTL, ECL, CMOS etc.) from a corresponding edge connector pin 16.

Each of the contacts 34" of each module is coupled to a separate boundary scan register 36". The registers 36" in each module are serially connected in a daisy chain and have a TDI and a TDO. The TDI of the boundary scan chain of registers 36" in the first module $31"_1$ is coupled to the TDO of a boundary scan test system 22. When each of the modules $31"_1$-$31"_m$ is mated in the body 30", each module $31"_i$ (where $1 < i < m$) has its TDI automatically coupled to the TDO of the module $31'_{i-1}$ and its TDO coupled to the TDI of the module $31"_{i+1}$. In this way, the boundary scan chains of registers 36" of the modules received in the body 30" are connected in a single-scan chain.

Moreover, each of the modules $31"_1$-$31"_m$ is also advantageously provided with a separate port 38, coupled to the TDO of its chain of boundary scan registers 36". The TDO port 38 of each of the modules $31"_1$-$31"_m$ provides a node at which the TDI of the circuit board 10 may be connected. For example, if the circuit board 10 has an equal or lesser number of edge connector pins 16 than the contacts 34" of the first module $31"_1$, so as to be accommodated thereby for mechanical engagement and electrical connection therewith, then the TDO port 38 of the first module is connected to the TDI of the board. However, should the circuit board 10 have a large number of edge connector pins 16, so as to require several of the modules $31"_1$-$31"_m$ for accommodating all of the pins, then the last of the modules in engagement with the circuit board has its TDO port 38 coupled to the TDI of the board. The TDO of the circuit board is connected to the STEM 28" for coupling through a TDO return line 40 in the STEM to the TDI input of the test system 22.

The STEM 28" operates in basically the same manner as the STEM's 28 and 28' of FIGS. 2 and 3, respectively. During boundary scan testing, a test signal is shifted through those of the boundary scan cells 36" in the modules $31"_1$-$31"_m$ whose corresponding contacts 34" are mated with corresponding edge connector pins 16. The same test signal is then shifted through the boundary scan cells 20 on the circuit board 10. After the test signal is shifted through the boundary scan registers 36" and 20, the bits stored in the registers are shifted out and are compared to a reference signal string. Any differences between the shifted-out bits and the reference signal string are indicative of a fault associated with either one of the devices $12_1$-$12_n$ on the circuit board 10 or an I/O connection made by one of the edge connector pins 16.

The foregoing describes different embodiments (28, 28' and 28") of a Serial Test Extension Module which serves to integrate the I/O connections on a circuit board 10 with the boundary scan devices $12_1$-$12_n$ on the board to allow both the devices and I/O connections to be tested simultaneously using boundary scan test techniques.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for testing a plurality of input/output connections of a circuit board, together with at least one device on the board which contains a plurality of first boundary scan registers, comprising the steps of:

coupling each input/output connection of the circuit board to a separate one of a plurality of second boundary scan registers so that each second boundary scan register is responsive to a signal present at a separate corresponding input/output connection;

serially coupling the second boundary scan registers with the first boundary scan registers to form a single, common daisy chain;

entering a known bit stream into the chain of first and second boundary scan registers to that a separate bit in the stream is latched into a separate one of the registers in the chain;

shifting out the bits latched into the chain of first and second boundary scan registers; and comparing the bits shifted out of the chain of first and second boundary scan registers to a reference bit stream corresponding to the bits shifted out of the chain of first and second boundary scan registers under defect-free conditions.

2. The method according to claim 1, wherein:

each input/output connection on the circuit board is made through a separate pin on an edge connector carried by the board;

each second boundary scan register is coupled to a separate contact of a socket complementary to the edge connector; and the coupling of each input/output connection of the circuit board to each second boundary scan register is accomplished by mating the socket associated with the second boundary scan registers with the edge connector on the circuit board so that each pin of the edge connector makes an electrical connection with each edge connector pin.

3. Apparatus for accomplishing testing of a plurality of input/output connections of a circuit board simultaneously with at least one device on the board containing a plurality of first boundary scan registers, comprising:

a plurality of second boundary scan registers coupled in series with the first boundary scan registers to form a single common chain of registers;

means for coupling each second boundary scan register to a separate input/output connection of the circuit board so that each second boundary scan register is responsive to a signal present at a separate corresponding input/output connection; and a boundary scan test system for launching a known stream of bits into the chain of first and second boundary scan registers and for shifting a stream of bits therefrom for comparison with a reference stream of bits representing a bit stream shifted from the first and second boundary scan registers when no defects are present.

4. The apparatus according to claim 3 wherein said coupling means comprises a socket for mating with the circuit board, the socket containing a plurality of contacts, each connected to a separate one of the second boundary scan registers and each making an electrical connection with a separate circuit board input/output connection when the circuit board mates with the socket.

5. The apparatus according to claim 3, further including a plurality of sockets, each mating with a circuit board of a different configuration, each socket containing a plurality of contacts, each contact in each socket connected in parallel with a corresponding contact in each of the other sockets to a separate one of the second boundary scan registers and each contact making an electrical connection with a separate circuit board input/output connection when the circuit board mates with the socket containing said contact.

6. Apparatus for accomplishing testing of a plurality of input/output connections of a circuit board and at least one boundary scan device on the board containing a plurality of first boundary scan registers, said apparatus comprising:

a plurality of second boundary scan registers coupled in series with a boundary scan tester and with the first boundary scan registers; and means for detachably coupling each second boundary scan register to each input/output connection of the circuit board.

7. The apparatus according to claim 6 wherein said coupling means comprises a socket for mating with the circuit board, the socket containing at least one contact coupled to a separate, second boundary scan register for making an electrical connection with a corresponding circuit board input/output connection when the circuit board is mated with the socket.

8. The apparatus according to claim 6 further including a plurality of sockets, each mating with a circuit board of a different configuration, each socket containing a plurality of contacts, each contact in each socket connected in parallel with a corresponding contact in each of the other sockets to a separate one of the second boundary scan registers, and each contact making an electrical connection with a separate circuit board input/output connection when the circuit board mates with the socket containing said contact.

* * * * *